(12) United States Patent
Huang et al.

(10) Patent No.: US 11,373,990 B2
(45) Date of Patent: Jun. 28, 2022

(54) SEMICONDUCTOR DEVICE AND METHOD OF STACKING SEMICONDUCTOR DIE FOR SYSTEM-LEVEL ESD PROTECTION

(71) Applicant: Semtech Corporation, Camarillo, CA (US)

(72) Inventors: Changjun Huang, Oak Park, CA (US); Jonathan Clark, Camarillo, CA (US)

(73) Assignee: Semtech Corporation, Camarillo, CA (US)

( * ) Notice: Subject to any disclaimer, the term of this patent is extended or adjusted under 35 U.S.C. 154(b) by 434 days.

(21) Appl. No.: 15/431,528

(22) Filed: Feb. 13, 2017

(65) Prior Publication Data

US 2017/0250172 A1    Aug. 31, 2017

Related U.S. Application Data

(60) Provisional application No. 62/301,045, filed on Feb. 29, 2016.

(51) Int. Cl.
*H01L 21/00* (2006.01)
*H01L 25/00* (2006.01)
(Continued)

(52) U.S. Cl.
CPC ........ *H01L 25/50* (2013.01); *H01L 21/76898* (2013.01); *H01L 23/49575* (2013.01); *H01L 23/60* (2013.01); *H01L 24/13* (2013.01); *H01L 24/14* (2013.01); *H01L 24/16* (2013.01); *H01L 24/81* (2013.01); *H01L 24/94* (2013.01);
(Continued)

(58) Field of Classification Search
CPC ............ H01L 2224/94; H01L 2224/97; H01L 2224/80; H01L 2224/81; H01L 2224/11849; H01L 2224/11901; H01L 2224/13111; H01L 2224/48091; H01L 2224/48145; H01L 2224/48247; H01L 2224/48465; H01L 25/0657
See application file for complete search history.

(56) References Cited

U.S. PATENT DOCUMENTS 8,552,569 B2    10/2013   Lee
2009/0051046 A1   2/2009   Yamazaki et al.
(Continued)

*Primary Examiner* — Meiya Li
(74) *Attorney, Agent, or Firm* — Brian M. Kaufman; Robert D. Atkins; Patent Law Group: Atkins and Associates, P.C.

(57) ABSTRACT

A semiconductor device has a first semiconductor die including a first protection circuit. A second semiconductor die including a second protection circuit is disposed over the first semiconductor die. A portion of the first semiconductor die and second semiconductor die is removed to reduce die thickness. An interconnect structure is formed to commonly connect the first protection circuit and second protection circuit. A transient condition incident to the interconnect structure is collectively discharged through the first protection circuit and second protection circuit. Any number of semiconductor die with protection circuits can be stacked and interconnected via the interconnect structure to increase the ESD current discharge capability. The die stacking can be achieved by disposing a first semiconductor wafer over a second semiconductor wafer and then singulating the wafers. Alternatively, die-to-wafer or die-to-die assembly is used.

19 Claims, 9 Drawing Sheets

(51) Int. Cl.
*H01L 23/00* (2006.01)
*H01L 23/60* (2006.01)
*H01L 23/495* (2006.01)
*H01L 21/768* (2006.01)
*H01L 25/065* (2006.01)
*H01L 23/29* (2006.01)
*H01L 21/56* (2006.01)
*H01L 23/31* (2006.01)
*H01L 21/304* (2006.01)
*H01L 21/78* (2006.01)
*H01L 27/02* (2006.01)

(52) U.S. Cl.
CPC .......... H01L 24/97 (2013.01); H01L 25/0657 (2013.01); *H01L 21/304* (2013.01); *H01L 21/561* (2013.01); *H01L 21/78* (2013.01); *H01L 23/295* (2013.01); *H01L 23/3121* (2013.01); *H01L 23/3171* (2013.01); *H01L 24/03* (2013.01); *H01L 24/05* (2013.01); *H01L 24/11* (2013.01); *H01L 24/17* (2013.01); *H01L 24/29* (2013.01); *H01L 24/32* (2013.01); *H01L 24/45* (2013.01); *H01L 24/48* (2013.01); *H01L 24/73* (2013.01); *H01L 24/80* (2013.01); *H01L 24/85* (2013.01); *H01L 27/0255* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04042* (2013.01); *H01L 2224/05009* (2013.01); *H01L 2224/0557* (2013.01); *H01L 2224/0558* (2013.01); *H01L 2224/05548* (2013.01); *H01L 2224/05568* (2013.01); *H01L 2224/05571* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06181* (2013.01); *H01L 2224/08146* (2013.01); *H01L 2224/08148* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13025* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/14181* (2013.01); *H01L 2224/16146* (2013.01); *H01L 2224/16147* (2013.01); *H01L 2224/16227* (2013.01); *H01L 2224/16245* (2013.01); *H01L 2224/17181* (2013.01); *H01L 2224/2929* (2013.01); *H01L 2224/32145* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/4847* (2013.01); *H01L 2224/48091* (2013.01); *H01L 2224/48145* (2013.01); *H01L 2224/48247* (2013.01); *H01L 2224/48463* (2013.01); *H01L 2224/48465* (2013.01); *H01L 2224/73253* (2013.01); *H01L 2224/73257* (2013.01); *H01L 2224/8082* (2013.01); *H01L 2224/80203* (2013.01); *H01L 2224/80895* (2013.01); *H01L 2224/8182* (2013.01); *H01L 2224/81203* (2013.01); *H01L 2224/81815* (2013.01); *H01L 2224/85203* (2013.01); *H01L 2224/85205* (2013.01); *H01L 2224/94* (2013.01); *H01L 2224/97* (2013.01); *H01L 2225/0651* (2013.01); *H01L 2225/06513* (2013.01); *H01L 2225/06517* (2013.01); *H01L 2225/06541* (2013.01); *H01L 2225/06565* (2013.01); *H01L 2924/1033* (2013.01); *H01L 2924/10252* (2013.01); *H01L 2924/10253* (2013.01); *H01L 2924/10272* (2013.01); *H01L 2924/10322* (2013.01); *H01L 2924/10324* (2013.01); *H01L 2924/10329* (2013.01); *H01L 2924/10335* (2013.01); *H01L 2924/1203* (2013.01); *H01L 2924/13091* (2013.01); *H01L 2924/141* (2013.01); *H01L 2924/143* (2013.01); *H01L 2924/1433* (2013.01); *H01L 2924/1434* (2013.01); *H01L 2924/1461* (2013.01)

(56) References Cited

U.S. PATENT DOCUMENTS

| | | |
|---|---|---|
| 2009/0115026 A1 | 5/2009 | Gerber et al. |
| 2011/0089557 A1* | 4/2011 | Shau ............... H01L 21/561 257/693 |
| 2011/0304010 A1 | 12/2011 | Jiang et al. |
| 2012/0028412 A1* | 2/2012 | Jeong ............ H01L 21/76898 438/107 |
| 2012/0077312 A1* | 3/2012 | Lee ................. H01L 21/563 438/108 |
| 2013/0009278 A1 | 1/2013 | Lee |
| 2014/0126089 A1 | 5/2014 | Chang et al. |
| 2014/0183758 A1* | 7/2014 | Nakamura .......... H01L 24/97 257/777 |
| 2016/0148907 A1* | 5/2016 | Segawa ............. H01L 23/522 257/369 |
| 2016/0320689 A1* | 11/2016 | Butterworth .......... H01L 33/58 |

* cited by examiner

000
SEMICONDUCTOR DEVICE AND METHOD OF STACKING SEMICONDUCTOR DIE FOR SYSTEM-LEVEL ESD PROTECTION

CLAIM TO DOMESTIC PRIORITY

The present application claims the benefit of U.S. Provisional Application No. 62/301,045, filed Feb. 29, 2016, which application is incorporated herein by reference.

FIELD OF THE INVENTION

The present invention relates in general to semiconductor devices and, more particularly, to a semiconductor device and method of stacking semiconductor die to provide system-level electro-static discharge (ESD), electrical overstress (EOS), and electrical fast transient (EFT) protection in a small semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), small signal transistor, resistor, capacitor, inductor, or power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

One goal of semiconductor manufacturing is to produce smaller semiconductor devices. Smaller devices typically consume less power, can be produced more efficiently, and have higher performance. In addition, smaller semiconductor devices have a smaller footprint, which is desirable for increasing the density of devices on printed circuit boards and reducing the size of end products. A smaller die size may be achieved by improvements in the front-end process resulting in semiconductor die with smaller, higher density active and passive components. Back-end processes may result in semiconductor device packages with a smaller footprint by improvements in electrical interconnection and packaging materials.

Semiconductor devices are known to be susceptible to damage from electrostatic discharge (ESD), electrical overstress (EOS), and electrical fast transients (EFT), collectively referred to as ESD events. When electrostatic charges accumulate on a human body for instance, a high static potential is formed with respect to ground. If the human body electrically contacts a semiconductor device, the static potential of the human body discharges an electrical current through the semiconductor device, which can damage the active and passive circuits of the semiconductor device given a sufficiently large electrical current. If a breakdown voltage of an individual circuit element is exceeded, then the semiconductor device can be rendered defective well before its useful life expectancy.

Semiconductor devices may contain a protection circuit for ESD events. The protection circuit has limited capability to discharge the current from the ESD event. To increase the protection capability, the semiconductor package is typically made larger to include more die area and handle a higher electric current. However, increasing semiconductor package size is inconsistent with the goal of smaller packages and end products. Many applications simply do not allow for larger semiconductor packages, even in situations that require greater ESD protection.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
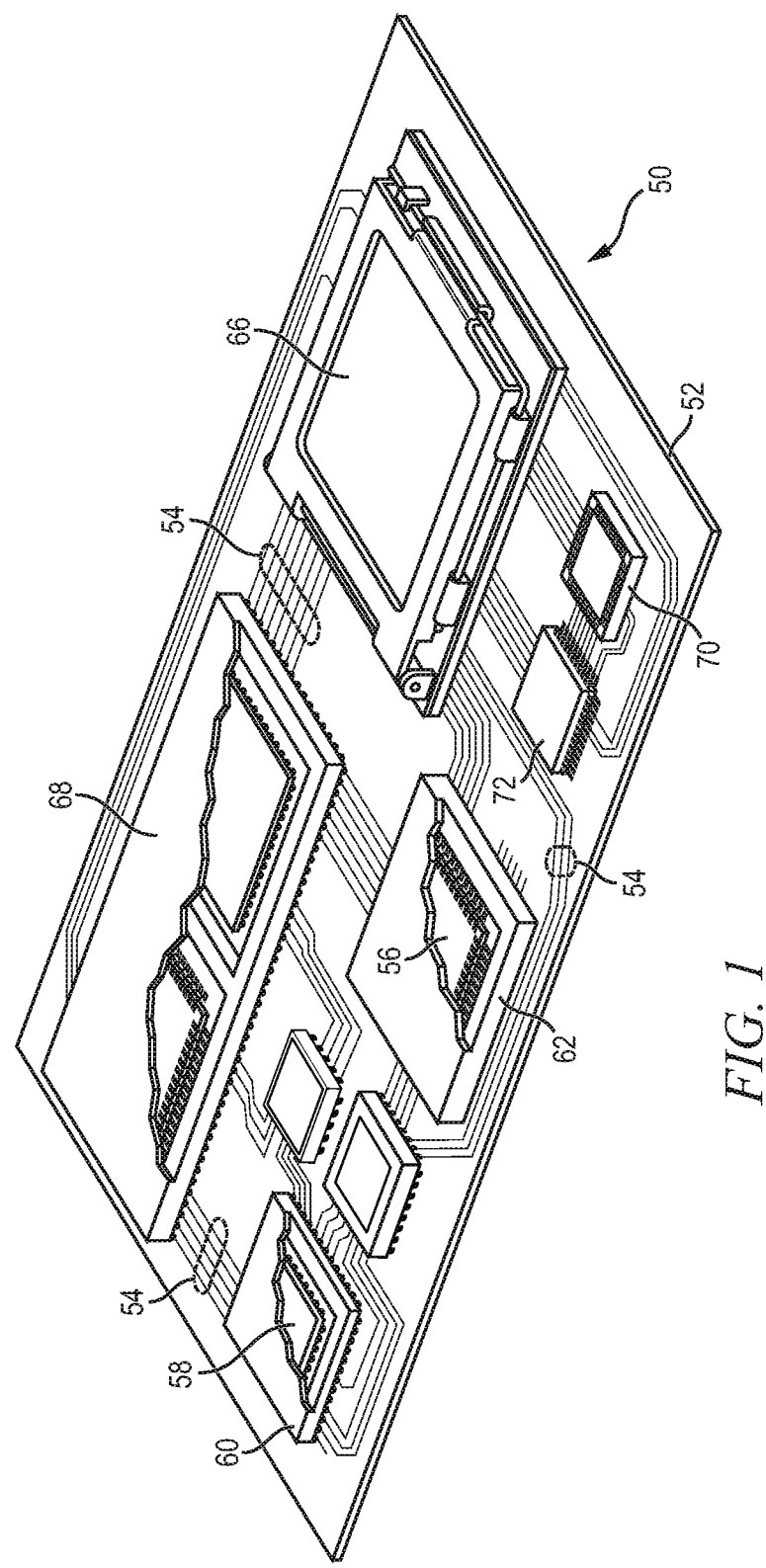
FIG. 1 illustrates a printed circuit board (PCB) with different types of packages mounted to a surface of the PCB.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

Figure 2A:
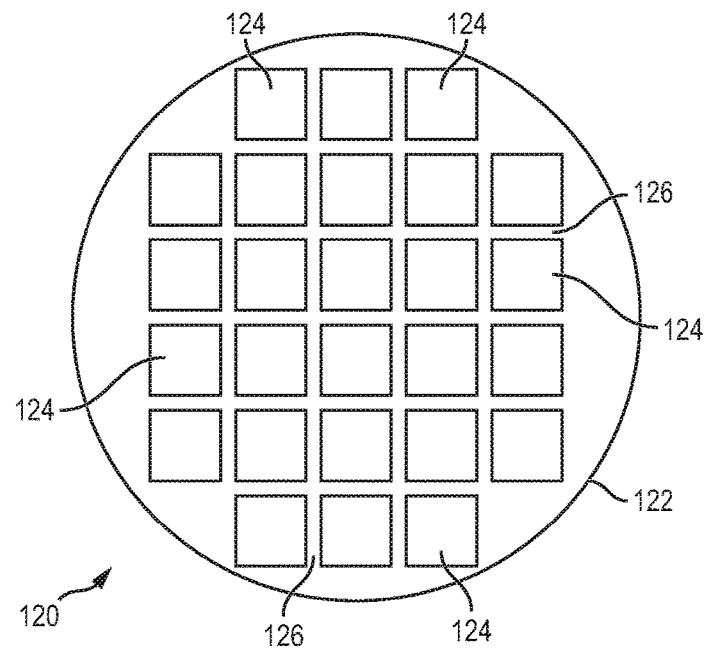
FIGS. 2a-2e illustrate a process of forming a semiconductor wafer with semiconductor die.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm) and thickness of 700 micrometers (μm). In another embodiment, semiconductor wafer 120 has a width or diameter of 100-450 mm.

Figure 2B:
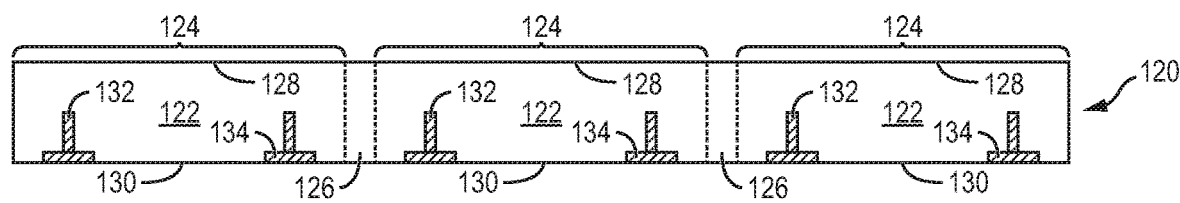

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. Semiconductor wafer 120 has a high resistivity, on the order of 1 k ohms/cm or greater. Active surface 130 can be implanted with oxide to suppress surface conduction.

A plurality of blind vias is formed partially through base substrate material 122 using laser drilling, mechanical drilling, deep reactive ion etching (DRIE), or other suitable process. The through vias are filled with aluminum (Al), copper (Cu), tin (Sn), nickel (Ni), gold (Au), silver (Ag), titanium (Ti), tungsten (W), poly-silicon, or other suitable electrically conductive material using electrolytic plating, electroless plating process, or other suitable metal deposition process to form z-direction vertical interconnect structures or conductive through silicon vias (TSV) 132.

An electrically conductive layer 134 is formed over active surface 130 using physical vapor deposition (PVD), chemical vapor deposition (CVD), electrolytic plating, electroless plating, or other suitable metal deposition process. Conductive layer 134 includes a surface coplanar with active surface 130. In another embodiment, conductive layer 134 is formed partially or completely over active surface 130.

Conductive layer 134 includes one or more layers of Al, Cu, Sn, Ni, Au, Ag, or other suitable electrically conductive material or combination thereof. Conductive layer 134 operates as contact pads electrically connected to the circuits on active surface 130, as well as conductive TSV 132. Conductive layer 134 is formed as contact pads disposed side-by-side a first distance from the edge of semiconductor die 124, as shown in FIG. 2b. Alternatively, conductive layer 134 is formed as contact pads that are offset in multiple rows such that a first row of contact pads is disposed a first distance from the edge of the die, and a second row of contact pads alternating with the first row is disposed a second distance from the edge of the die. In one embodiment, semiconductor die 124 is a discrete transient voltage suppression (TVS) diode, and only two contact pads 134 are provided for the two diode terminals.

Portions of conductive layer 134 are electrically common or electrically isolated depending on the routing design and function of semiconductor die 124. In some embodiments, conductive layer 134 operates as a redistribution layer (RDL) to extend electrical connection from conductive TSV 132 and laterally redistribute electrical signals to other areas of semiconductor die 124. In another embodiment, conductive layer 134 operates as a wire bondable pad or layer for electrical interconnection to and from conductive TSV 132.

Figure 2C:
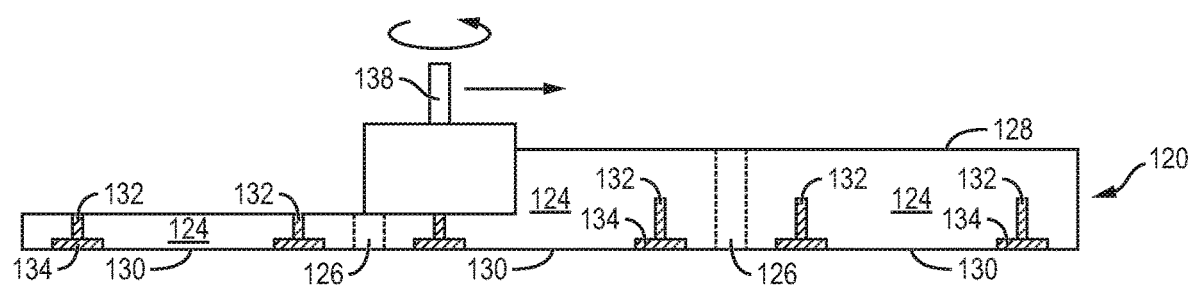

In FIG. 2c, back surface 128 of semiconductor wafer 120 undergoes a backgrinding operation with grinder 138 or other suitable mechanical, chemical, or etching process to remove a portion of base material 122. The backgrinding operation reduces the thickness of semiconductor wafer 120 including semiconductor die 124 and reveals conductive TSV 132. In one embodiment, semiconductor die has a post-grinding thickness of 50-200μm. After the backgrinding operation, TSV 132 include surfaces coplanar with the new back surface 128 of semiconductor die 124.

Figure 2D:
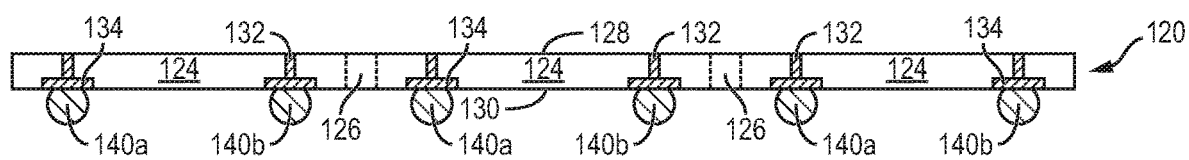

In FIG. 2d, an electrically conductive bump material is deposited over conductive layer 134 using an evaporation, electrolytic plating, electroless plating, ball drop, or screen printing process. The bump material includes Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form spherical balls or bumps 140. In some applications, bumps 140 are reflowed a second time to improve electrical contact to conductive layer 134. The bumps can also be compression bonded to conductive layer 134. Bumps 140 represent one type of interconnect structure that is formed over conductive layer 134. The interconnect structure can also use bond wires, stud bump, micro bump, or other electrical interconnect. Bumps 140 or other interconnect structures are optional and can be formed after singulation of semiconductor wafer 120.

Figure 2E:
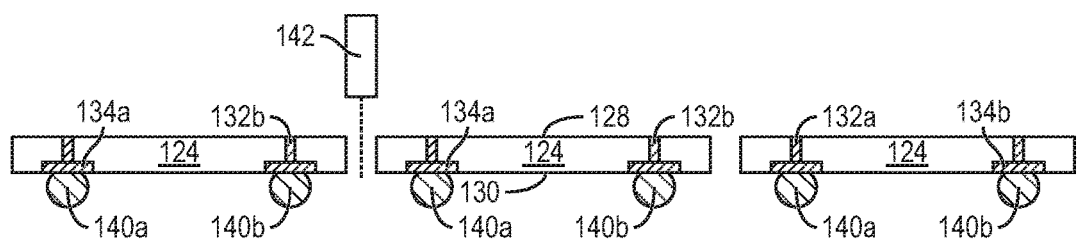

In FIG. 2e, semiconductor wafer 120 is singulated through saw street 126 using a saw blade or laser cutting tool 142 into individual semiconductor die 124. In another embodiment, semiconductor wafer 120 is singulated into individual semiconductor die 124 using DRIE.

Semiconductor die 124 operates with semiconductor packages 56, 58, 60, 62, 66, 68, 70, and 72 on PCB 52 to provide protection from an ESD event. When electrostatic charge accumulates on a human body, a high static voltage potential is formed with respect to ground. If the human body electrically contacts the semiconductor device, the static potential injects large currents and discharges through the device, which can damage the active and passive circuits on the device.

In one embodiment, semiconductor die 124 is dedicated to ESD protection. For example, semiconductor die 124 includes one or more transistors, diodes, and other circuit elements formed within active surface 130 to implement an ESD protection circuit, which provides fifty amps or more of peak current discharge or dissipation. In another embodiment, each semiconductor die 124 is a discrete TVS diode that conducts electricity from terminal 140*a* to terminal 140*b* when a voltage across the terminals exceeds a threshold. When the voltage potential across terminals 140*a* and 140*b* is below the threshold, the TVS diode of semiconductor die 124 approximates an open circuit between the terminals.

Figure 3:
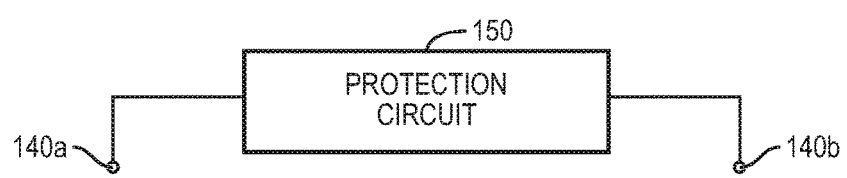
FIG. 3 illustrates a protection circuit formed on the semiconductor die.

FIG. 3 shows TVS diode or protection circuit 150 of semiconductor die 124. An input of protection circuit 150 is commonly coupled to conductive layer 134*a*, conductive TSV 132*a*, and bump 140*a*. An output of protection circuit 150 is commonly coupled to conductive layer 134*b*, conductive TSV 132*b*, and bump 140*b*. Bump 140*a* of semiconductor die 124 is connected to a circuit node on PCB 52, common with one or more semiconductor packages 56, 58, 60, 62, 66, 68, 70, and 72, on which the ESD event may occur. Bump 140*b* is coupled to a ground potential node.

In normal operation with say 2.5 volts, protection circuit 150 is non-active and electrical signals flow to semiconductor packages 56, 58, 60, 62, 66, 68, 70, and 72 on PCB 52. During an ESD event, a voltage spike or transient condition on the circuit node of PCB 52 is also incident to bump 140*a* and activates protection circuit 150 (or turns on TVS 150). When activated, protection circuit 150 discharges the current spike associated with the ESD event through conductive layer 134*b* and bump 140*b* to ground. For example, the ESD event could be caused by a human body containing an electrostatic charge contacting one or more semiconductor packages 56, 58, 60, 62, 66, 68, 70, and 72 on PCB 52. Protection circuit 150 detects the resulting voltage transient at bump 140*a* and discharges the high current through semiconductor die 124 to ground.

Protection circuit 150 can be implemented with a voltage clamping circuit connected to bump 140*a* and containing one or more transistors with sufficient rating to discharge or dissipate a large ESD current of 50 amps or more. Semiconductor packages 56, 58, 60, 62, 66, 68, 70, and 72 are protected from the ESD event by electrical current being shunted through semiconductor die 124 rather than through the packages on PCB 52. Other bumps 140 of other semiconductor die 124 are connected to other circuit nodes on PCB 52 that are susceptible to an ESD event.

Figure 4A:
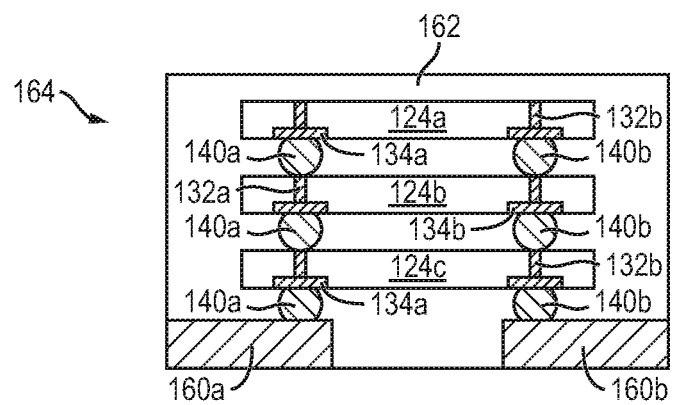
FIGS. 4a-4b illustrate a semiconductor package with stacked semiconductor die each containing the protection circuit, and the semiconductor package coupled to protect a load from ESD events.

The space available on PCB 52 for ESD protection is limited. FIG. 4*a* illustrates a device with increased ESD current discharge capability and a small semiconductor package size. As described in FIG. 2*c*, semiconductor die 124 undergo backgrinding to reduce die thickness. A plurality of semiconductor die 124 are stacked on substrate or leadframe 160 to form semiconductor package 164. Semiconductor die 124*c*, as singulated from semiconductor wafer 120 in FIG. 2*e*, is disposed over leadframe 160 with bumps 140 bonded to terminals 160*a* and 160*b*. Bumps 140 of semiconductor die 124*c* are within a footprint of an individual leadframe contact 160*a* and 160*b*, and between an individual leadframe contact and semiconductor die 124*c*. Bumps 140 of semiconductor die 124*c* are reflowed to mechanically and electrically couple semiconductor die 124*c* to leadframe 160 through the bumps.

Semiconductor die 124*b*, as also singulated from semiconductor wafer 120, is disposed over semiconductor die 124*c* with bumps 140 of semiconductor die 124*b* bonded to conductive TSV 132 of semiconductor die 124*c*. Semiconductor die 124*a*, as singulated from semiconductor wafer 120, is disposed over semiconductor die 124*b* with bumps 140 of semiconductor die 124*a* bonded to conductive TSV 132 of semiconductor die 124*b*. Accordingly, semiconductor die 124*a*-124*c* are stacked and electrically connected in parallel between leadframe contacts 160*a* and 160*b* through the interconnect structure comprising conductive layer 134, conductive TSVs 132, and bumps 140. While each active surface of each semiconductor die 124 is oriented in a common directions, many TVS diode embodiments are symmetrical and may be stacked face-to-face or back-to-back at the die or wafer level.

The interconnect structure between semiconductor die 124*a*-124*c* can also be implemented with wire bonds, stud bumps, conductive paste, direct die attach, or other electrical interconnect structures. For example, protection circuit 150 in each semiconductor die 124*a*-124*c* are commonly connected with wire bonds. Alternatively, the thickness of semiconductor package 164 can be further reduced by bonding conductive layer 134*a* of semiconductor die 124*c* directly to terminals 160*a*-160*b*, i.e., without bumps 140. Conductive layer 134*a* of semiconductor die 124*b* is bonded directly to conductive TSV 132*a* of semiconductor die 124*c*, and conductive layer 134*a* of semiconductor die 124*a* is bonded directly to conductive TSV 132*a* of semiconductor die 124*b*. Direct metal-to-metal bonding of contact pads 134*a* to terminals 160*a*-160*b*, or to conductive vias 132, is done using thermocompression bonding on one embodiment.

An encapsulant or molding compound 162 is deposited over semiconductor die 124*a*-124*c* and leadframe 160 as an insulating material using a paste printing, compressive molding, transfer molding, liquid encapsulant molding, vacuum lamination, spin coating, or other suitable applicator. Encapsulant 162 includes polymer composite material, such as epoxy resin, epoxy acrylate, or polymer with proper filler. Encapsulant 162 is non-conductive and environmentally protects the semiconductor device from external elements and contaminants.

Figure 4B:
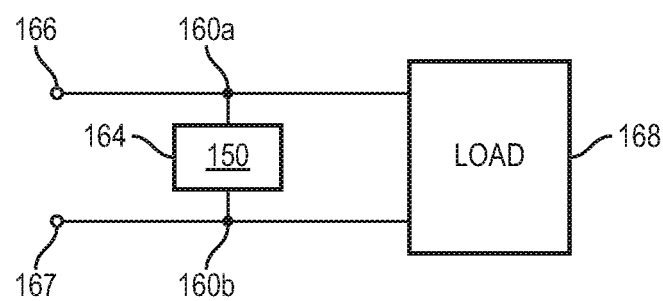

FIG. 4*b* illustrates semiconductor package 164 with protection circuits 150 coupled between input terminals 166-167 and a load circuit 168 to protect the load circuit from ESD events on input terminals 166-167. Load circuit 168 represents semiconductor packages or other electrical circuits of electronic device 50 for which ESD protection is desired. Input terminals 166-167 represent electrical power and ground inputs to electronic device 50. In other embodiments, input terminals 166-167 represent analog or digital inputs or outputs of electronic device 50, e.g., a headphone jack or universal serial bus port of a cell phone or tablet computer. Semiconductor package 164 is coupled between input terminal 166 and input terminal 167, which operates as a ground node for signal transmission.

In normal operation with a voltage of say 2.5 volts, protection circuits 150 on semiconductor die 124*a*-124*c* are non-active and electrical signals flow to semiconductor packages 56, 58, 60, 62, 66, 68, 70, and 72 on PCB 52. The electrical signals to semiconductor packages 56, 58, 60, 62, 66, 68, 70, and 72 are coupled to package 164 so that, during an ESD event, a voltage spike or transient condition on a circuit node of PCB 52 is also incident on bump 140*a*. With the die stacking and common interconnect structure for protection circuits 150 on semiconductor die 124*a*-124*c*, the voltage spike is simultaneously incident on conductive layer 134*a* and conductive TSV 132*a* of each semiconductor die 124*a*-124*c*.

Protection circuits 150 on each semiconductor die 124*a*-124*c* are coupled in parallel between an electrical signal and a ground voltage node. Each semiconductor die 124 senses the voltage transient condition simultaneously and activates to collectively discharge electrical charge from the ESD event as a relatively high electrical current through conductive layer 134b, conductive TSVs 132b, and bumps 140b to ground. For example, the ESD event could be caused by a human body containing an electrostatic charge contacting one or more semiconductor packages 56, 58, 60, 62, 66, 68, 70, and 72 on PCB 52. Protection circuits 150 on semiconductor die 124a-124c detect or are activated by the resulting voltage spike and discharge electric current through conductive layer 134b, conductive TSVs 132b, and bumps 140b to ground.

In embodiments where semiconductor die 124 contain a discrete TVS diode, the ESD event exceeds the turn-on voltage of the TVS diodes of each semiconductor die coupled in parallel. Electrical current from the ESD event is routed through each semiconductor die 124 in parallel to a ground voltage node. Semiconductor packages 56, 58, 60, 62, 66, 68, 70, and 72 are thus isolated from the ESD event. Multiple semiconductor packages 164 can be used to couple multiple ESD sensitive circuit nodes on PCB 52 to ground when an ESD event occurs on the particular node.

The stacked nature and common electrical connection of protection circuits 150 on semiconductor die 124a-124c increases the ESD protection capability of semiconductor package 164 without a significant increase in the package footprint. Electrically connecting multiple semiconductor die 124 in parallel within package 164 causes electric current from an ESD event to be routed through any number of parallel protection circuits 150. While a single protection circuit 150 may only be rated to route say one-hundred milliamps of current, connecting three semiconductor die 124 in parallel within package 164 creates a package that can handle three times the current, or up to three-hundred milliamps.

The increased ESD protection capability is thanks to the parallel semiconductor die 124 distributing the high ESD current among the multiple protection circuits 150 of the stacked semiconductor die. Protection circuits 150 on the stacked semiconductor die 124a-124c operate collectively to increase the total silicon surface area allocated for discharge or dissipation of the ESD current spike through conductive layer 134b, conductive TSVs 132b, and bumps 140b to ground. The increase in current-handling capability occurs without a significant increase in package footprint because the additional current-handling capability is provided by additional semiconductor die 124 stacked within the same footprint as other semiconductor die.

Semiconductor package 164 in FIG. 4a contains three stacked semiconductor die 124a-124c, each having a protection circuit 150 commonly connected through the interconnect structures comprising conductive layer 134, conductive TSVs 132, and bumps 140. The high ESD protection capability for semiconductor package 164 is achieved in a small package size by nature of minimizing the thickness of semiconductor die 124a-124c, as described in FIG. 2c, and then stacking the thinned semiconductor die, as shown in FIG. 4a. In one embodiment, the length and width dimensions of each semiconductor die 124 is 1 mm×1 mm with a thickness of 50-200 μm. The number of stacked semiconductor die 124 in semiconductor package 164 can vary depending on the protection requirements. Semiconductor package 164 can contain as many semiconductor die 124 stacked and electrically coupled in parallel as practical and necessary to realize the target ESD protection capability, e.g., 5-7 stacked semiconductor die are used in some embodiments.

In addition to protection circuit 150, active surface 130 may include analog circuits or digital circuits, such as digital signal processor (DSP), ASIC, MEMS, memory, or other signal processing circuit. In one embodiment, active surface 130 contains a MEMS, such as an accelerometer, gyroscope, strain gauge, microphone, or other sensor responsive to various external stimuli. Semiconductor die 124 may also contain integrated passive devices (IPDs), such as inductors, capacitors, and resistors, for signal processing or conditioning.

Figure 5A:
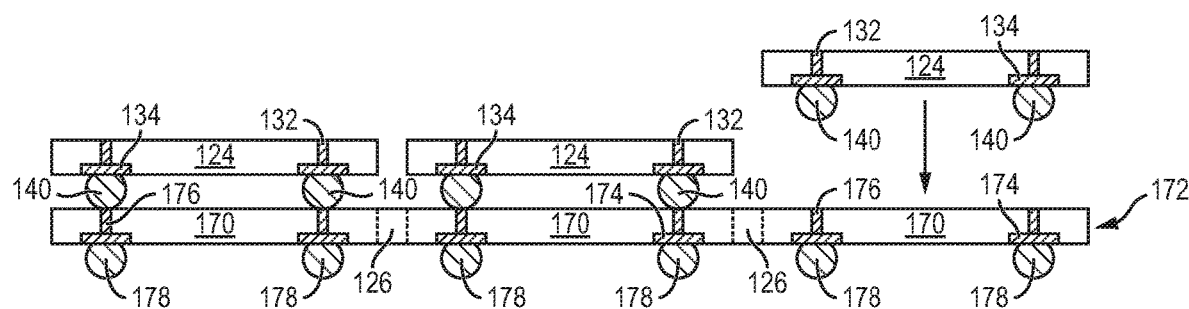
FIGS. 5a-5c illustrate stacking a semiconductor die over a semiconductor wafer.
Figure 5B:
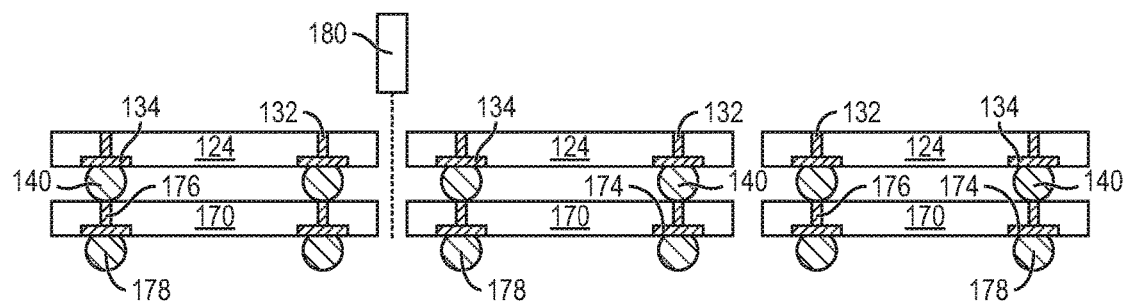
Figure 5C:
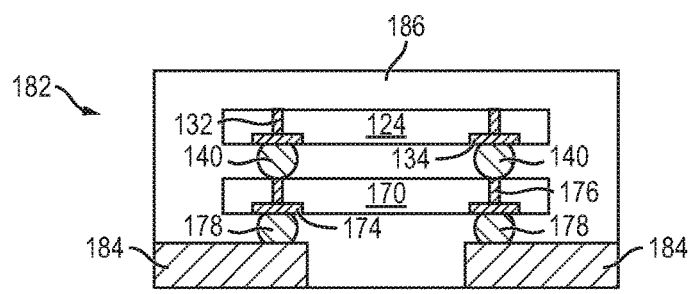

FIGS. 5a-5c illustrate another embodiment with the singulated semiconductor die 124 from FIG. 2e mounted over semiconductor die 170 of semiconductor wafer 172. Semiconductor wafer 172 follows a similar construction as semiconductor wafer 120. Conductive layer 174, conductive TSV 176, and bumps 178 are formed for semiconductor die 170, similar to FIG. 2b. Semiconductor die 124 and 170 each contain protection circuit 150, e.g., a TVS diode. In FIG. 5a, after backgrinding semiconductor wafer 172, similar to FIG. 2c, semiconductor die 124 are picked and placed in alignment with corresponding semiconductor die 170. Bumps 140 of semiconductor die 124 are bonded to conductive TSV 176 in semiconductor die 170.

In FIG. 5b, semiconductor wafer 172 is singulated using a saw blade or laser cutting tool 180 into individual stacks of semiconductor die 124 and 170. FIG. 5c shows semiconductor package 182 with stacked semiconductor die 124 and 170 mounted to substrate or leadframe 184 and covered with encapsulant 186, similar to FIG. 4a. Semiconductor package 182 provides increased ESD protection capability, due to a plurality of protection circuits 150 coupled in parallel in a small semiconductor package as described for semiconductor package 164.

Figure 6A:
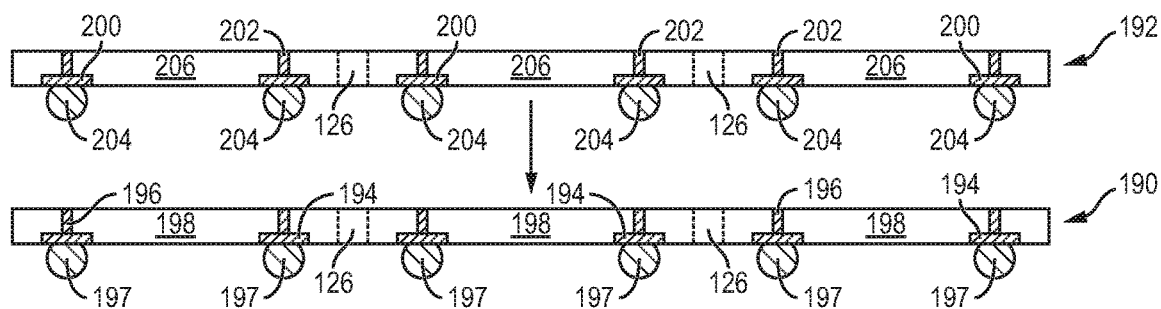
FIGS. 6a-6c illustrate stacking a first semiconductor wafer over a second semiconductor wafer.
Figure 6B:
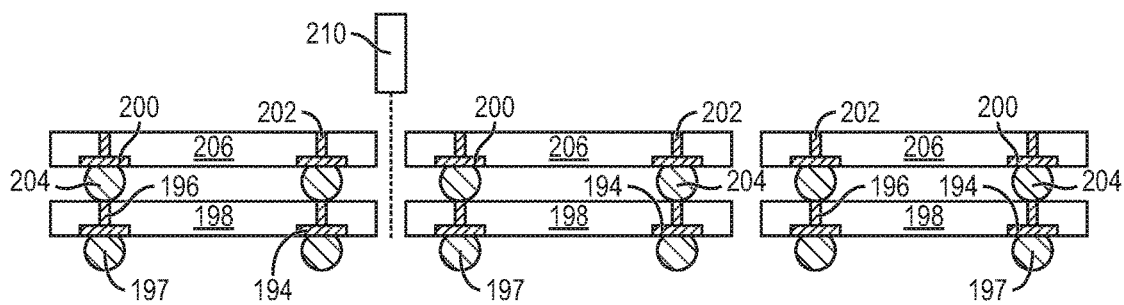
Figure 6C:
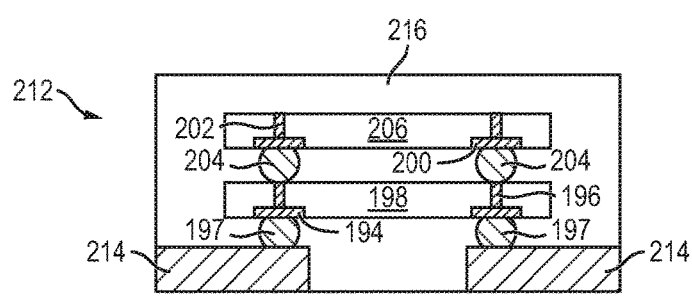

FIGS. 6a-6c illustrate another embodiment with semiconductor wafer 192 mounted over semiconductor wafer 190. Semiconductor wafer 190 and 192 follow a similar construction as semiconductor wafer 120. Conductive layer 194, conductive TSV 196, and bumps 197 are formed for semiconductor die 198, similar to FIG. 2b. Likewise, conductive layer 200, conductive TSV 202, and bumps 204 are formed for semiconductor die 206. Semiconductor die 198 and 206 each contain protection circuit 150. In FIG. 6a, after backgrinding semiconductor wafers 190 and 192, similar to FIG. 2c, semiconductor wafer 192 is mounted to semiconductor wafer 190 with semiconductor die 206 aligned to semiconductor die 198. Bumps 204 of semiconductor die 206 are bonded to conductive TSV 196 in semiconductor die 198.

In FIG. 6b, semiconductor wafers 190 and 192 are singulated using a saw blade or laser cutting tool 210 into individual stacked semiconductor die 198 and 206. FIG. 6c shows semiconductor package 212 with stacked semiconductor die 198 and 206 mounted to substrate or leadframe 214 and covered with encapsulant 216, similar to FIG. 4a. Semiconductor package 212 provides high ESD protection capability, as described for semiconductor package 164, in a small semiconductor package.

FIGS. 6a-6c illustrate wafer-to-wafer bonding of protection devices, while FIGS. 5a-5c illustrate die-to-wafer bonding. In some embodiments, wafer-to-wafer bonding is combinable with die-to-wafer bonding. For instance, semiconductor die 124 from FIG. 5a can be bonded over semiconductor wafer 192 in FIG. 6a before or after semiconductor wafer 192 is bonded to semiconductor wafer 190.

Figure 7A:
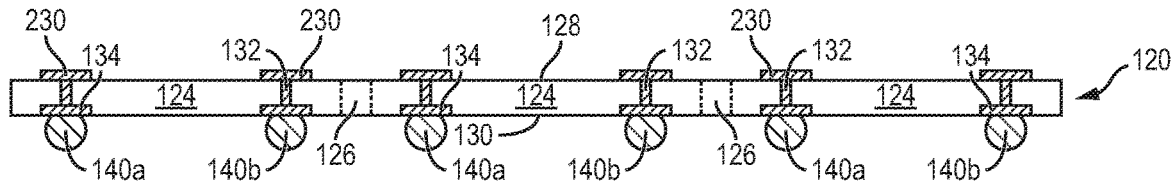
FIGS. 7a-7d illustrate contact pads formed on back surfaces of the semiconductor wafers or semiconductor die.

FIGS. 7a-7d illustrate forming a conductive layer 230 over back surface 128 of semiconductor die 124 after backgrinding semiconductor wafer 12C in FIG. 2c. In FIG. 7a, conductive layer 23C forms contact pads over each conductive via 132 for improved bonding of bumps 140 to back surface 128 of the semiconductor die. In other embodiments, conductive layer 230 includes conductive traces for redistribution of electrical signals to alternative locations on back surface 128. Conductive layer 230 is formed in a similar manner to conductive layer 134.

Figure 7B:
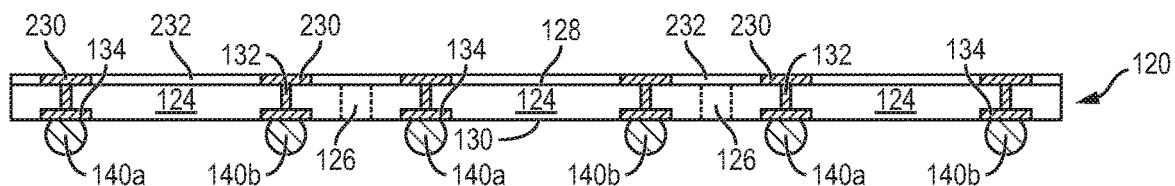

In FIG. 7b, an optional insulating or passivation layer 232 is formed over back surface 128 around conductive layer 230. Insulating layer 232 is formed using PVD, CVD, printing, lamination, spin coating or spray coating. Insulating layer 232 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, or other material having similar insulating and structural properties. A portion of insulating layer 232 is removed by etching or laser direct ablation (LDA) to form openings in the insulating layer and expose conductive layer 230 for subsequent electrical interconnect. In some embodiments, a portion of insulating layer 232 is removed by backgrinding to expose conductive layer 230 from the insulating layer and create a surface of the insulating layer that is coplanar with a surface of the conductive layer.

Figure 7C:
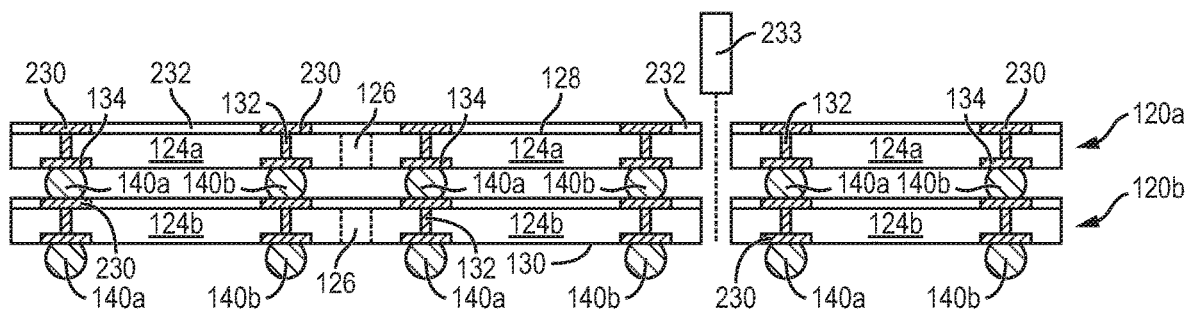

In FIG. 7c, a plurality of conductive wafers 120 with conductive layer 230 are stacked and connected through conductive bumps 140. Conductive bumps 140 are reflowed between contact pads 134 of one semiconductor wafer 120 and contact pads 230 of a second semiconductor wafer to mechanically bond and electrically couple the wafers to each other. Any desired number of semiconductor wafers 120 can be stacked and connected in parallel. The semiconductor wafers 120 are then singulated into individual devices by saw blade or laser cutting tool 233. Semiconductor die 124 with conductive layer 230 can also be stacked die-to-die after singulating or die-to-wafer.

Figure 7D:
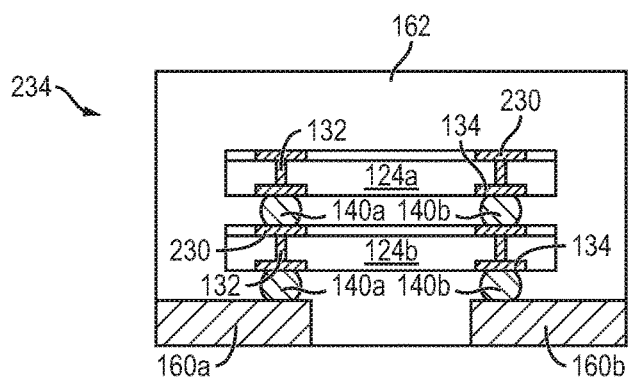

The singulated units of stacked semiconductor die 124 singulated in FIG. 7c are disposed over leadframe 160 and connected co contacts 160a-160b through bumps 140 of semiconductor die 124b in FIG. 7d. Encapsulant 162 is deposited over leadframe 160 and semiconductor die 124 for electrical isolation and environmental protection. Semiconductor die 124a and 124b are coupled in parallel between terminals 160a and 160b. Generally, leadframe 160 is provided as a relatively large sheet and many units of stacked semiconductor die 124 are disposed over a single leadframe and encapsulated together. Encapsulant 162 extends between each semiconductor die 124 and between leadframe 160 and semiconductor die 124b. Leadframe 160 is normally on a carrier while encapsulant 162 is deposited, resulting in a lower surface of encapsulant 162 that is coplanar with the bottom of leadframe 160.

After encapsulation, the plurality of TVS packages 234 are singulated through leadframe 160 and encapsulant 162 to separate the individual packages. Singulation cuts through leadframe 160 and creates new side surfaces or flanks of terminals 160a-160b that are exposed from encapsulant 162. TVS package 234 is disposed on PCB 52 in FIG. 1, and terminals 160a and 160b are soldered to conductive pads or traces on the PCB to protect a circuit element from ESD events. The exposed side surfaces of terminals 160a-160b are wettable by solder and increase the surface area for solder between TVS package 234 and PCB 52.

Figure 8A:
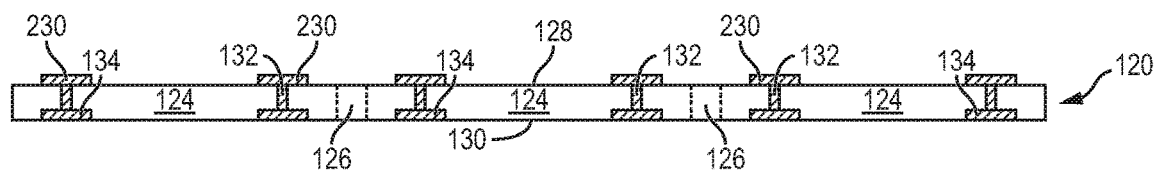
FIGS. 8a-8c illustrate bonding semiconductor wafer or semiconductor die together using thermocompression.
Figure 8B:
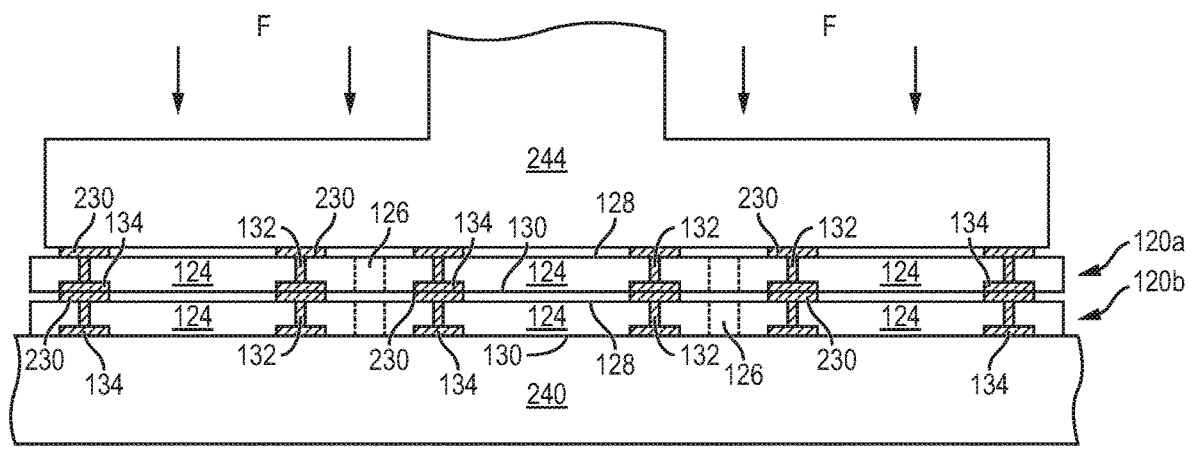
Figure 8C:
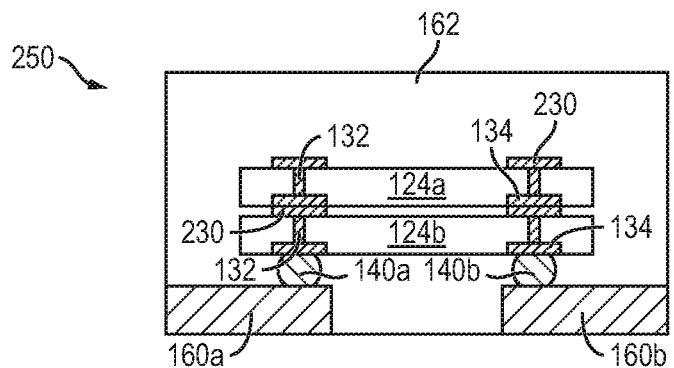

FIGS. 8a-8c illustrate stacking a plurality of semiconductor wafers 120 with the wafers mechanically and electrically connected to each other by thermocompression or diffusion bonding. FIG. 8a illustrates wafer 120 with contact pads 230 and without conductive bumps 140 or insulating layer 232. In FIG. 8b, a plurality of wafers 120 from FIG. 8a are stacked between a bottom plate 240 and a top plate 244 of a thermocompression fixture. Plates 240 and 244 are used to apply force and heat to semiconductor wafers 120. The heat and pressure between contact pads 230 and contact pads 134 causes metal atoms within aligned contact pads to diffuse into each other.

After wafers 120 are bonded together by thermocompression, the stacked wafers are singulated and mounted onto leadframe 160 using conductive bumps 140. The stacked semiconductor die 124 are coupled to leadframe 160 by thermocompression without conductive bumps 140 in other embodiments. Thermocompression of wafers 120 to leadframe 160 can be in a common thermocompression step with the bonding of wafers 120 to each other, or performed as another thermocompression step. Thermocompression can be wafer-to-wafer, die-to-wafer, or die-to-die. Encapsulant 162 is deposited over semiconductor die 124 and leadframe 160 to form a panel, and then the panel is singulated to separate TVS packages 250 from each other. Using thermocompression bonding reduces the overall thickness of TVS package 250 by eliminating the thickness of conductive bumps 140 between some or all device layers.

Figure 9:
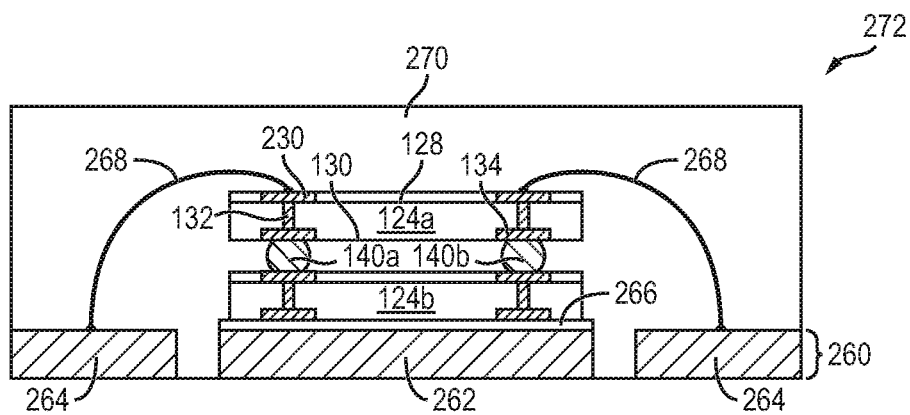
FIG. 9 illustrates coupling a stack of semiconductor die to a leadframe using bond wires.

FIG. 9 illustrates another embodiment with leadframe 260 having a die pad 262 in addition to leads 264. Any of the previously disclosed semiconductor die stacks are disposed on die pad 262 with an optional adhesive layer 266. Stacks of semiconductor die 124 can be disposed over die pad 262 with active surfaces 130 oriented either toward or away from the die pad. In some embodiments, active surfaces 130 of semiconductor die 124 are oriented in opposite directions. Adhesive layer 266 provides electrical isolation between semiconductor die 124 and die pad 262 in embodiments where desired. Contact pads 230 or 134, depending on the orientation of the top semiconductor die 124, are coupled to leads 264 by bond wires 268. Bond wires 268 are mechanically and electrically coupled to contact pads 230 and terminals 264 by thermocompression bonding, ultrasonic bonding, wedge bonding, stitch bonding, ball bonding, or other suitable bonding technique. Bond wires 268 include a conductive material such as Cu, Al, Au, Ag, a combination thereof, or another suitable conductive material.

Encapsulant 270 is deposited over semiconductor die 124, leadframe 260, and bond wires 268 to form a sheet of encapsulated devices. The sheet is singulated by a saw blade or laser cutting tool to produce individual TVS devices 272. TVS device 272 increases protection capability by coupling a plurality of thinned protection devices in parallel without significantly increasing device size.

The stacked semiconductor die with interconnected protection circuits provide a system-level ESD protection with a small package form-factor. The power handling capability (power rating) per unit dimension of the semiconductor package is increased by the stacking topology to increase the total silicon surface area allocated for discharge or dissipation of the ESD current spike, while maintaining a small package form factor by stacking protection circuits in a common footprint. The energy from an ESD event is distributed and dissipated through the commonly connected protection circuits of each stacked semiconductor die. The stacked nature of multiple semiconductor die each with a protection circuit provides the ability to increase the ESD protection capability without significantly increasing package size. The stacked topology can be achieved by die-to-die, die-to-wafer, or wafer-to-wafer stacking processes.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
  providing a first semiconductor die comprising a first transient voltage suppression (TVS) diode;
  disposing a second semiconductor die comprising a second TVS diode over the first semiconductor die;
  disposing the first semiconductor die and the second semiconductor die over a leadframe, wherein a first terminal of the first TVS diode is directly electrically coupled to a first terminal of the second TVS diode, and wherein a second terminal of the first TVS diode is directly electrically coupled to a second terminal of the second TVS diode;
  depositing an encapsulant over the first semiconductor die, the second semiconductor die, and the leadframe; and
  singulating through the encapsulant to form a semiconductor package, wherein the semiconductor package is configured to protect a separate semiconductor package from a transient electrical signal by routing the transient electrical signal through the first TVS diode and the second TVS diode in parallel.

2. The method of claim 1, further including bonding the first semiconductor die to the leadframe using a conductive bump.

3. The method of claim 1, further including bonding the first semiconductor die to the second semiconductor die using a conductive bump.

4. The method of claim 1, further including bonding the first semiconductor die to the second semiconductor die using thermocompression.

5. The method of claim 1, further including:
  forming a conductive via in the first semiconductor die;
  backgrinding the first semiconductor die to expose the conductive via; and
  disposing the second semiconductor die over the first semiconductor die with a contact pad of the second semiconductor die aligned with the conductive via.

6. A method of making a semiconductor device, comprising:
  providing a first semiconductor die including a first discrete transient voltage suppression (TVS) diode;
  providing a second semiconductor die including a second discrete TVS diode;
  disposing the second semiconductor die over the first semiconductor die with the first discrete TVS diode and the second discrete TVS diode electrically coupled in parallel;
  disposing the first semiconductor die and the second semiconductor die over a substrate, wherein the first and the second semiconductor die are configured to semiconductor die protect a separate semiconductor package from an electrical transient when the separate semiconductor package is coupled to the first semiconductor die and the second semiconductor die through the substrate; and
  depositing an encapsulant over the first semiconductor die and the second semiconductor die.

7. The method of claim 6, wherein the substrate includes a leadframe.

8. The method of claim 6, further including disposing a third semiconductor die over the first semiconductor die and the second semiconductor die.

9. The method of claim 6, wherein the semiconductor device has exactly two electrical terminals.

10. A method of making a semiconductor device, comprising:
  providing a first semiconductor die comprising a first discrete transient voltage suppression (TVS) diode;
  providing a second semiconductor die comprising a second discrete TVS diode; and
  disposing the first semiconductor die and the second semiconductor die over a leadframe with the first discrete TVS diode and the second discrete TVS diode coupled in parallel, wherein the first discrete TVS diode and the second discrete TVS diode are configured to protect a separate semiconductor package from a transient electrical signal by coupling the separate semiconductor package to the leadframe.

11. The method of claim 10, further including:
  providing a third semiconductor die comprising a third discrete TVS diode; and
  disposing the third semiconductor die over the first semiconductor die and the second semiconductor die with the third discrete TVS diode electrically coupled in parallel with the first discrete TVS diode and the second discrete TVS diode.

12. The method of claim 10, further including:
  forming a first conductive via through the first semiconductor die;
  forming a second conductive via through the second semiconductor die; and
  connecting the first conductive via to the second conductive via.

13. The method of claim 10, further including depositing an encapsulant over the first semiconductor die, the second semiconductor die, and the leadframe.

14. A method of making a semiconductor device, comprising:
  providing a first semiconductor die comprising a first discrete transient voltage suppression (TVS) diode;
  providing a second semiconductor die comprising a second discrete TVS diode;
  disposing the second semiconductor die over the first semiconductor die with the first discrete TVS diode and the second discrete TVS diode electrically coupled in parallel; and
  depositing an encapsulant over the first semiconductor die and the second semiconductor die.

15. The method of claim 14, wherein the semiconductor device has exactly two electrical terminals.

16. The method of claim 14, wherein the semiconductor device is configured to protect a separate semiconductor package from a transient voltage.

17. The method of claim 14, further including:
  providing a third semiconductor die comprising a third discrete TVS diode; and
  disposing the third semiconductor die over the first semiconductor die and the second semiconductor die with the third discrete TVS diode electrically coupled in parallel with the first discrete TVS diode and the second discrete TVS diode.

18. The method of claim 14, further including:
  forming a first conductive via through the first semiconductor die;
  forming a second conductive via through the second semiconductor die; and
  connecting the first conductive via to the second conductive via.

19. The method of claim 1, wherein the semiconductor package has exactly two terminals.

\* \* \* \* \*

UNITED STATES PATENT AND TRADEMARK OFFICE
CERTIFICATE OF CORRECTION

PATENT NO. : 11,373,990 B2
APPLICATION NO. : 15/431528
DATED : June 28, 2022
INVENTOR(S) : Changjun Huang et al.

Page 1 of 1

It is certified that error appears in the above-identified patent and that said Letters Patent is hereby corrected as shown below:

In the Claims

Column 11, Lines 51-52, add -- semiconductor die -- after the word first.

Column 11, Line 53, delete "semiconductor die" before the word protect.

Signed and Sealed this
Twenty-sixth Day of July, 2022

Katherine Kelly Vidal
*Director of the United States Patent and Trademark Office*